United States Patent [19]
Peake et al.

[11] Patent Number: 6,122,109
[45] Date of Patent: Sep. 19, 2000

[54] NON-PLANAR MICRO-OPTICAL STRUCTURES

[75] Inventors: Gregory M. Peake; Stephen D. Hersee, both of Albuquerque, N. Mex.

[73] Assignee: The University of New Mexico, Albuquerque, N. Mex.

[21] Appl. No.: 09/291,991

[22] Filed: Apr. 15, 1999

Related U.S. Application Data

[60] Provisional application No. 60/082,180, Apr. 16, 1998.

[51] Int. Cl.[7] .............................. G02B 27/10; G02B 13/18; G02B 9/00; G03C 5/00; B29D 11/00
[52] U.S. Cl. .......................... 359/620; 359/719; 359/796; 430/320; 216/26
[58] Field of Search ...................................... 359/619, 620, 359/718, 720, 796, 719; 501/900; 430/321, 313; 216/2, 26

[56] References Cited

U.S. PATENT DOCUMENTS

| | | | |
|---|---|---|---|
| 4,380,365 | 4/1983 | Gross | 350/96.15 |
| 4,950,622 | 8/1990 | Kwon et al. | 437/129 |
| 5,212,113 | 5/1993 | Azoulay et al. | 437/107 |
| 5,253,263 | 10/1993 | Jansen et al. | 372/45 |
| 5,284,791 | 2/1994 | Sakata et al. | 437/129 |
| 5,327,415 | 7/1994 | Vettiger et al. | 369/121 |
| 5,382,543 | 1/1995 | Nakamura et al. | 437/129 |
| 5,388,548 | 2/1995 | Coudenys et al. | 117/89 |
| 5,563,969 | 10/1996 | Honmou | 385/35 |
| 5,604,635 | 2/1997 | Lawandy | 359/620 |
| 5,633,527 | 5/1997 | Lear | 257/432 |
| 5,663,075 | 9/1997 | Robinson | 438/92 |
| 5,671,243 | 9/1997 | Yap | 372/50 |
| 5,701,373 | 12/1997 | Oleskevich | 385/33 |
| 5,811,322 | 9/1998 | Robinson | 438/92 |
| 5,838,854 | 11/1998 | Taneya et al. | 385/50 |
| 5,882,468 | 3/1999 | Crockett et al. | 156/345 |
| 6,001,540 | 12/1999 | Huang et al. | 430/321 |

OTHER PUBLICATIONS

Armor, et al., Experimental and Theoretical Analysis of Shadow–Masked Growth Using Organometalic Vapor Phase Epitaxy: The reason for the Absence of Faceting. J. Appl. Phys. Jan. 1995, vol. 77, No. 2, pp. 873–878, especially pp. 873–876.

Sandusky et al., Characterization of Non–Planar Shadow Masked Al(x)Ga(1–x)AS Structures by Confocal Photoilluminescence Microscopy. In Proceedings of the IEEE Lasers nad Electro–Optics Society 7th Annual Meeting, IEEE, 1994, vol. 2, pp. 5–6.

Sankur et al., Fabrication of Refractive Microlens Arrays. In Micro–Optics/Micromechanics and Laser Scanning and Shaping, Topical Conference, Edited by E. Motamedi & L. Beiser, SPIE—The International Society for Optical Engineering (1995) vol. 2383, pp. 179–183.

Peake et al., GaAs Microlens Arrays Grown by Shadow Masked MOVPE, J. Elec. Matl. (1997) vol. 26, No. 10, see pp. 1134–1136.

*Primary Examiner*—Georgia Epps
*Assistant Examiner*—David N. Spector
*Attorney, Agent, or Firm*—Jagtiani & Associates

[57] ABSTRACT

In one embodiment, the present invention provides a microlens having very small focal length. The present invention also provides a non-planar microstructure having a covering layer which is slowly oxidizing or substantially free of oxygen. The present invention also provides methods for forming such microlenses and microstructures. In addition, the present invention provides a VCSEL which includes one or more non-planar microstructures of the present invention.

17 Claims, 16 Drawing Sheets

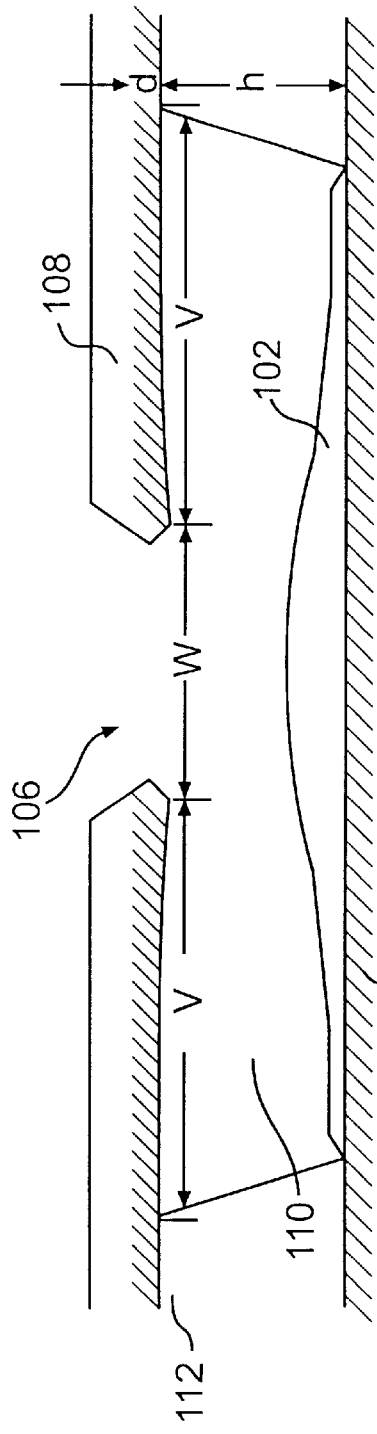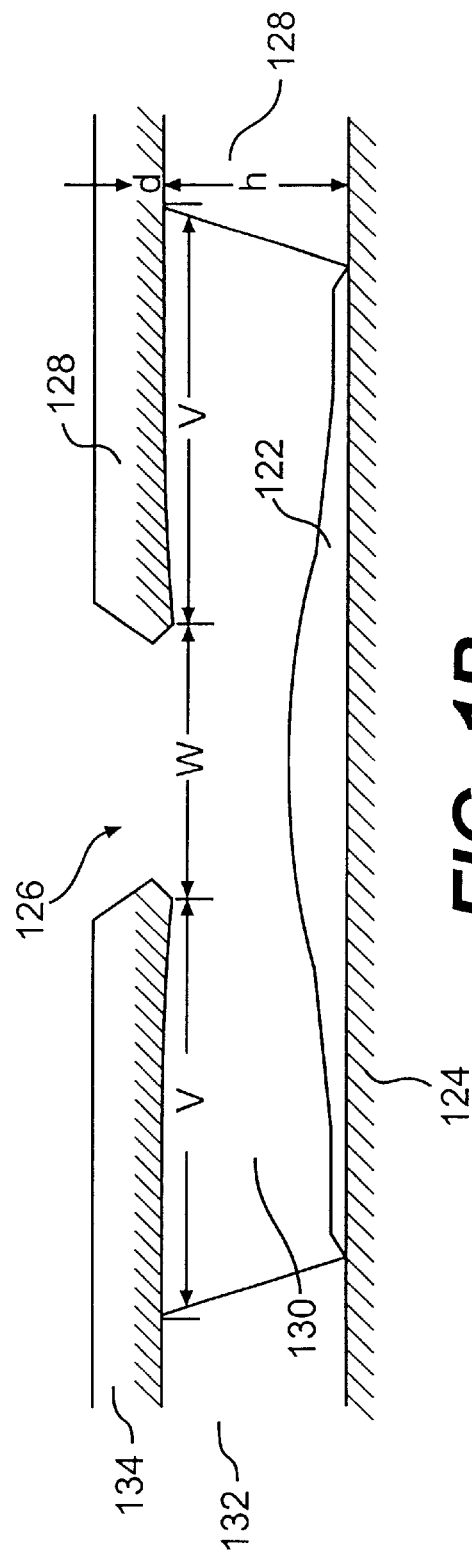

NON-PLANAR MICRO-OPTICAL STRUCTURES

CROSS-REFERENCE TO RELATED APPLICATIONS

This application is based on U.S. Provisional Application No. 60/082,180 filed Apr. 16, 1998, the entire contents and disclosure of which is hereby incorporated by reference.

STATEMENT OF GOVERNMENT INTEREST

This invention is made with government support under grant number MDA972-98-1-0002, awarded by the United States Defense Advanced Research Projects Agency and grant number F49620-96-1-0079, awarded by the Air Force Office of Scientific Research. The government may have certain rights in this invention.

BACKGROUND OF THE INVENTION

1. Field of the Invention

The present invention relates generally to microlenses and microlens arrays and methods of forming microlenses and microlens arrays.

2. Description of the Prior Art

Microlenses have been fabricated using a number of different methods in the past including planar ion-exchange, photoresist and plastic flow, microjet printing, reactive ion etching and laser ablation. However, while many of these techniques may produce acceptable microlenses, these prior methods frequently use non-standard processes and are not easily integrated into the manufacturing of optoelectronic devices.

SUMMARY OF THE INVENTION

It is therefore an object of the present invention to provide a method for producing microlenses that can be directly integrated into the fabrication process of microoptical systems.

It is another object of the present invention to provide an epitaxial growth method that is capable of producing highly nonplanar features that are free from macroscopic facetting.

According to one aspect of the present invention, there is provided a microlens having a focal length of 50 µm or less.

According to a second aspect of the present invention, there is provided an array of microlenses mounted on a substrate, each of the microlenses having a focal length of 50 µm or less.

According to a third aspect of the present invention, there is provided a non-planar microstructure comprising a first layer comprising at least one first CVD material selected from the group consisting of: a rapidly oxidizing CVD material and an oxygen-containing CVD material; and a covering layer comprising at least one second CVD material selected from the group consisting of: a slowly oxidizing CVD material and a substantially oxygen free CVD material, the covering layer substantially covering a top surface of the first layer.

According to a fourth aspect of the present invention, there is provided a method for making at least one non-planar microstructure comprising the steps of: depositing at least one CVD material through at least one window of a mask layer and an opening in a spacer layer beneath the mask layer to form a non-planar microstructure on a substrate, the mask layer being separated from the substrate by the spacer layer and overhanging the spacer layer; and removing the mask layer and the spacer layer by applying a removal solution to the mask layer and the spacer layer which does not react with the non-planar microstructure.

According to a fifth aspect of the present invention, there is provided a vertical cavity surface emitting laser structure comprising: a vertical cavity surface emitting laser; and at least one non-planar microstructure at one end of the vertical cavity surface emitting laser.

According to a sixth aspect of the present invention, there is provided a method for making at least one non-planar microstructure comprising the steps of: depositing at least one CVD material through at least one window of a shadow mask to form a non-planar microstructure on a substrate, the shadow mask including an overhanging region which overhangs a spacer region which is directly bonded to said substrate.

Other objects and features of the present invention will be apparent from the following detailed description of the preferred embodiments.

BRIEF DESCRIPTION OF THE DRAWINGS

The invention will be described in conjunction with the accompanying drawings, in which:

FIG. 1A is a cross-sectional view of shadow mask geometry after the regrowth of a sample in accordance with one preferred method of the present invention;

FIG. 1B is a cross-sectional view of shadow mask geometry after the regrowth of a sample in accordance with another preferred method of the present invention;

DETAILED DESCRIPTION OF THE PREFERRED EMBODIMENT

Definitions

Figure 2:
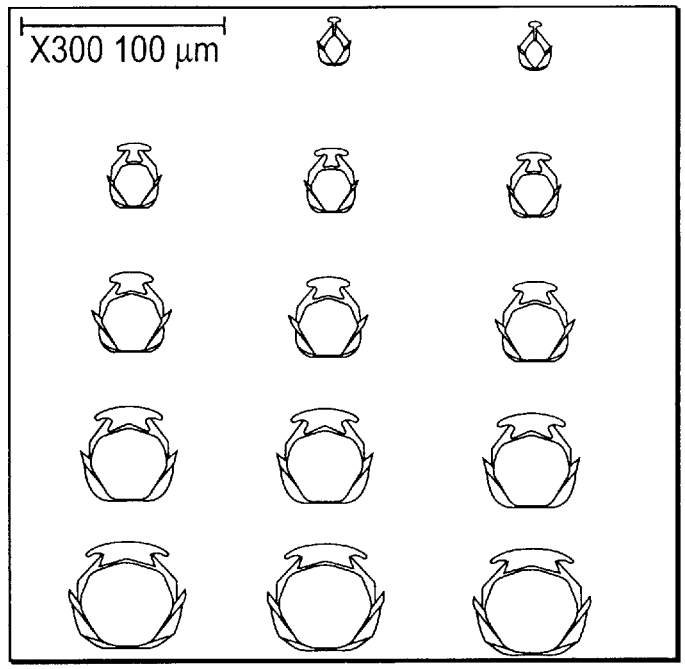
FIG. 2 illustrates a lens array of the present invention with a shadow mask in place.

For the purposes of the present invention the terms "sub-millimeter microlens" or "microlens" refer to a substantially circular lens having a diameter less than 1 millimeter.

For the purposes of the present invention, the term "microstructure" refers to a structure which is less than 1 millimeter in diameter, width or length in at least one dimension. For the purposes of the present invention, the term "non-planar microstructure" refers to microstructures which have a top surface including one or more regions which are curved in at least one direction. One example of a non-planar microstructure is a microlens.

For the purposes of the present invention, the term "micro-optical" structure refers to a microstructure through which light waves, such as the light waves of a laser beam, may pass.

For the purposes of the present invention, the term "array" refers to at least two microlens deposited or mounted on the same substrate.

For the purposes of the present invention, the term "CVD" refers to any method of chemical vapor deposition including: MOCVD, OMCVD, etc. or a method of vapor phase epitaxy including OMVPE, MOVPE, etc.

For the purposes of the present invention, the term "CVD material" refers to any material which may be deposited on a substrate using chemical vapor deposition technology. Examples of CVD materials include semiconductor materials such as Si and GaAs, crystalline materials such as diamond, polycrystalline and amorphous materials such as $SiN_x$, etc. The CVD material of the present invention may be deposited by mixing various source materials, such as arsine and trimethylgallium for depositing GaAs or silane and ammonia for $SiN_x$.

For the purposes of the present invention the term "semiconductor material" refers to both doped and undoped semiconductor materials, unless the semiconductor material is specifically referred to as a doped semiconductor material or an undoped semiconductor material.

For the purposes of the present invention, the term "group III–V semiconductor material" refers to any semiconductor material comprised of one or more group III elements: B, Ga, Al, In, etc. and one or more group V elements: N, As, Sb, P, Bi, etc.

For the purposes of the present invention, the term "mask layer" refers to a single shadow mask having one or more windows or a number of shadow mask sections, each with one or more windows.

For the purposes of the present invention, the term "spacer layer" refers to a continuous layer or a layer divided into sections which is located between a shadow mask layer and the substrate on which a CVD material of the present invention is deposited.

For the purposes of the present invention, the term "FWHM" refers to full width at half maximum.

For the purposes of the present invention, the term "high concentration aluminum layer" refers to a layer having a concentration of at least about 70% Al.

For the purposes of the present invention, the term "RIE" refers to reactive ion etch. For the purposes of the present invention, the term "deep RIE" refers to a reactive ion etch deeper than 10 $\mu$m.

For the purpose of the present invention, the term "ITO" refers to indium tin oxide.

For the purposes of the present invention, the term "rapidly oxidizing" refers to an oxidation rate faster than about 1 $\mu$m/hour.

For the purpose of the present invention, the term "slowly oxidizing" refers to an oxidation rate slower than about 0.1 $\mu$m/hours.

For the purposes of the present invention, the term "DBR" refers to a distributed Bragg reflector.

For the purposes of the present invention, the term "SEM" refers to a scanning electron micrograph.

For the purposes of the present invention, the term "direct bonding" refers to techniques for bonding a structure directly to a substrate such as: wafer bonding, fusion bonding, direct wafer bonding, direct fusion bonding, etc.

Description

The method of the present invention is based on shadow masked chemical vapor deposition (CVD) which is an improvement on conventional epitaxial growth technologies in that the method of the present invention is capable of producing highly nonplanar features that are entirely free from facetting. Conventional photolithography or a permanent mask is used to determine the size, shape and location of the entire lens array. Furthermore, different lens shapes and sizes can be grown simultaneously and the microlenses produced by the method of the present invention may be directly integrated into the fabrication process of microoptical systems. Using the method of the present invention it is also possible to produce high quality microlens arrays with precise control of aperture, sagitta, focal length, astigmatism and position.

In one preferred method of the present invention, a spacer layer, preferably having an aluminum content of 70% or greater, most preferably 90% or greater, is deposited on a substrate using conventional techniques. Many different types of substrates may be used for the purposes of the present invention, but a preferred substrate is GaAs. A preferred material for the spacer layer is AlGaAs. On top of the spacer layer, there is deposited a mask layer using conventional techniques for depositing mask layers. Although many materials may be suitable for the mask layer, a preferred material is GaAs.

After the mask layer is deposited, a window is etched in the mask layer using conventional etching techniques. A preferred technique is to use photolithography followed by treatment with an etching solution. In this preferred technique, a window pattern is first etched into the mask layer with an etching solution, such as $NH_4OH$:$H_2O_2$: $H_2O$ at room temperature. For mask layers used to produce microlenses of the present invention, the window in the mask layer is circular, but may be other shapes depending on the microstructure to be formed. When an array of microstructures is to be formed, several windows may be etched in the mask layer.

Once the window in the shadow mask is etched, a selective etching solution is applied which only etches the spacer layer and does not etch the mask layer nor the substrate. One preferred etching solution is KI: $I_2$: $H_3PO_4$. The selective etching is applied in amount sufficient so that the spacer layer is undercut and the mask layer overhangs the spacer layer, preferably by a few microns. For microlenses of about 30 µm or less in diameter, the overhang is preferably approximately 10 µm. After etching the spacer layer, the mask layer, spacer layer and substrate are preferably washed with a conventional cleaning solution such as water to removed any remaining etching solution or debris present.

At least one CVD material is then deposited through the window of the mask layer on the substrate using a conventional CVD process such as using a metalorganic CVD (MOCVD) reactor. For depositing GaAs microstructures on the substrate, preferred source materials are arsine and trimethylgallium. Additional CVD materials may deposited after the first CVD material is deposited. For example, after depositing a first CVD material such as $SiO_2$, which contains oxygen, a second CVD material such as GaAs, which is free of oxygen, may be deposited over the $SiO_2$ microstructure to form a covering layer to protect the microstructure from a HF acid solution applied in the "lift-off" or removal step of the method of the present invention.

After the microstructure has been deposited on the substrate, the mask layer and spacer layer are removed by applying a solution containing HF to the spacer layer to etch and remove the spacer layer, and, thereby, remove the mask layer from the substrate as well. The high concentration of Al in the spacer layer makes the spacer layer capable of being etched and removed by the HF solution. After the mask layer and spacer layer have been removed, the microstructure on the substrate may be used as is or, in other applications, may be further processed. To insure that the deposited microstructure is not affected by the HF solution, the microstructure is comprised of a material that is slowly oxidizing or substantially free of oxygen or is coated by a covering layer that is slowly oxidizing or substantially free of oxygen.

The above-described embodiment of the method of the present invention is illustrated in FIG. 1A. This method uses an epitaxial mask that is grown by a conventional MOVPE process and then patterned by conventional photolithography and wet etching. The sample is then returned to the reactor for shadow masked growth. FIG. 1A illustrates the shadow mask geometry after the sample regrowth. A nonplanar microstructure 102 is deposited on a GaAs substrate 104 through a window 106 of a GaAs shadow mask 108 and an opening 110 in a spacer layer 112 which is on top of the substrate 104. Theoretical analysis of shadow-masked CVD shows that the growth rate and detailed shape of the microlens is controlled by the geometrical parameters of the mask: space layer thickness h; mask layer thickness d; window width w; and mask overhang distance v.

In a second preferred embodiment of the method of the present, the method of the present invention uses a removable micromachined mask which combines the functions of the shadow mask and spacer layer of the previously described embodiment. A preferred material for the micromachined mask of the present invention is Si. The micromachined mask may be formed by etching a large opening from the bottom of a silicon wafer, and aligning and etching a smaller window that is etched through the previously formed opening. Preferably, a layer of $SiO_2$ is grown over all of the surfaces of the micromachined mask. In this method, the micromachined mask is mounted directly on the substrate by direct bonding and then the CVD material is deposited through the window and opening on the substrate. After a non-planar microstructure of the present invention has been deposited on the substrate, the micromachined mask is removed from the substrate by conventional thermal or mechanical shock methods used to remove direct bonded structures from substrate materials. This method has the advantage of using a shadow mask which may be used over and over again to form non-planar microstructures of the present invention.

FIG. 1B illustrates the above-described embodiment of the method of the present invention which uses a removable micromachined shadow mask. FIG. 1B illustrates the shadow mask geometry after the sample regrowth. A nonplanar microstructure 122 is deposited on a substrate 124 through a window 126 in an Si shadow mask 128 and an opening 130, which is also in the shadow mask 128. Shadow mask 128 is mounted directly on the substrate 124 by direct fusion bonding. The shadow mask 128 includes a spacer region 132, which functions similarly to the spacer layer 112 of the method of FIG. 1A, and an overhang region 134, which functions similarly to the shadow mask 108 of the method of FIG. 1A. Theoretical analysis of shadow-masked CVD shows that the growth rate and detailed shape of the microlens is controlled by the geometrical parameters of the mask: space layer thickness h; mask layer thickness d; window width w; and mask overhang distance v.

In one embodiment, the present invention provides a method for the fabrication of sub-millimeter microlenses and microlens arrays that exhibit diffraction limited performance. The present invention also provides novel shadow mask materials.

In another embodiment the present invention provides optoelectronic devices employing the microlenses and microlens arrays of the present invention.

The microlenses of the present invention are preferably fabricated in GaAs, but may also be fabricated in other semiconductor materials such as Si, Ge, etc., group III–V semiconductor materials such as InP, GaP, InAs, InSb, SiN, etc., various ternary and quaternary alloys of these semiconductor materials and in oxides, nitrides, and other dielectrics that can be deposited by chemical vapor deposition (CVD).

The microlenses and microlens arrays of the present invention may be directly integrated onto an underlying structure during growth. Additionally, different curvature lenses may be fabricated within the same growth sequence. The method of the present produces microlenses having excellent uniformity. The microlenses of the present invention exhibit diffraction limited performance with focal lengths ranging from 40 to 150 microns and with FWHM less than 2 microns, so the lenses of the present invention are compatible with coupling to single mode fibers.

The present invention provides a method for fabricating microlenses and microlens arrays that use photolithography, wet-chemical etching and shadow-masked CVD. Specifically, the method of the present invention allows for shadow masked chemical vapor deposition with concentrically variable refractive index control in the direction of wave propagation. Microlenses with apertures as small as at least 30 μm may be fabricated in GaAs with focal lengths as small as 50 μm or less, preferably 40 μm or less, most preferably 30 μm or less. The lenses produced by the method of the present invention are preferably spherical and are not subject to facetting. The microlenses may have beam waists as small as 2 μm and the lenses of the present invention may operate near the diffraction limit.

The method of the present invention allows for the material refractive index of a microlens to be precisely controlled with respect to the position of the microlens in advanced structures.

Although GaAs is a preferred substrate material for practicing the methods of the present invention, other substrates may be used as well, because there is no necessity in the method of the present invention that the substrate have the same crystal lattice spacing as the deposited material. In some embodiments of the present invention, the vapor phase deposition of a material on mismatched substrate may be exploited to put microlenses on charge coupled device (CCD) pixels or GaAs waveguides on silicon substrates for integration with the shadow masked technique of the present invention.

The microlenses of the present invention may be aligned. For example, an upper structure 1402 have an array of convex microlenses 1404 mounted thereon may be aligned with a lower structure 1406 on which are mounted an array of micro mirrors 1408.

Other alignments may be obtained using an aligner/bonder for direct fusion bonding of the deposited structures, such as microlenses, of the present invention on various substrates.

Figure 15:
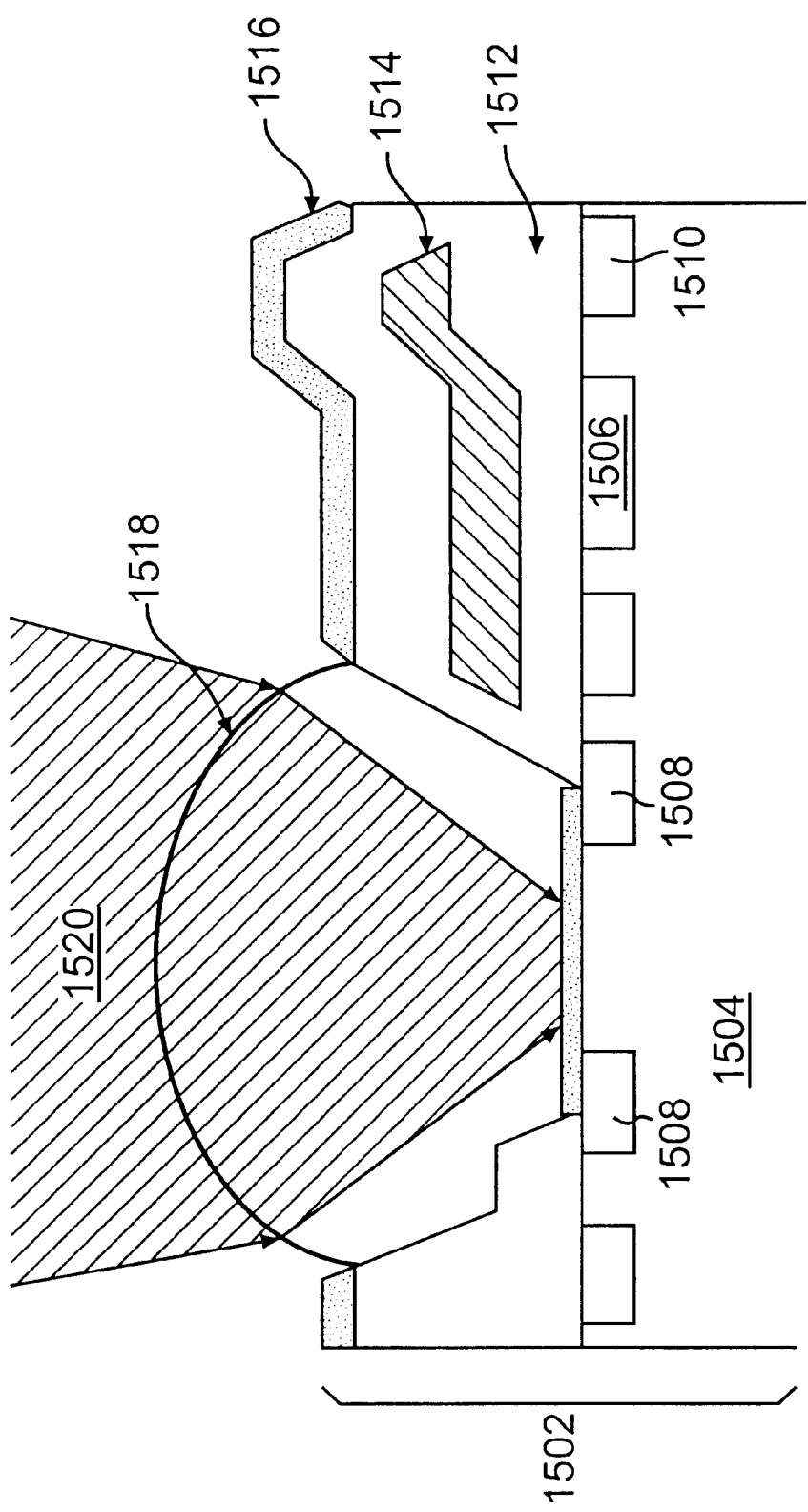
FIG. 15 illustrates a charge coupled device of the present invention integrated with a microlens of the present invention.

The present invention also contemplates a CCD comprising an array of closely spaced diodes that may be grown in a semiconductor material with the inclusion of a microlens to more efficiently collect the incoming light as shown in FIG. 15. In FIG. 15 a CCD device 1502 includes a substrate 1504 having a buried CCD channel 1506, a guard ring 1508 and a channel stop 1510. On top of the substrate 1504 are deposited successively an oxide or dielectric layer 1512, a CCD transfer gate 1514 and a light shield 1516. A microlens 1518 is also mounted on the substrate 1504 to receive incoming light 1520 By growing a shadow masked microlens of the present invention, the CCD structure and microlens may be fabricated in one growth sequence.

Figure 16:
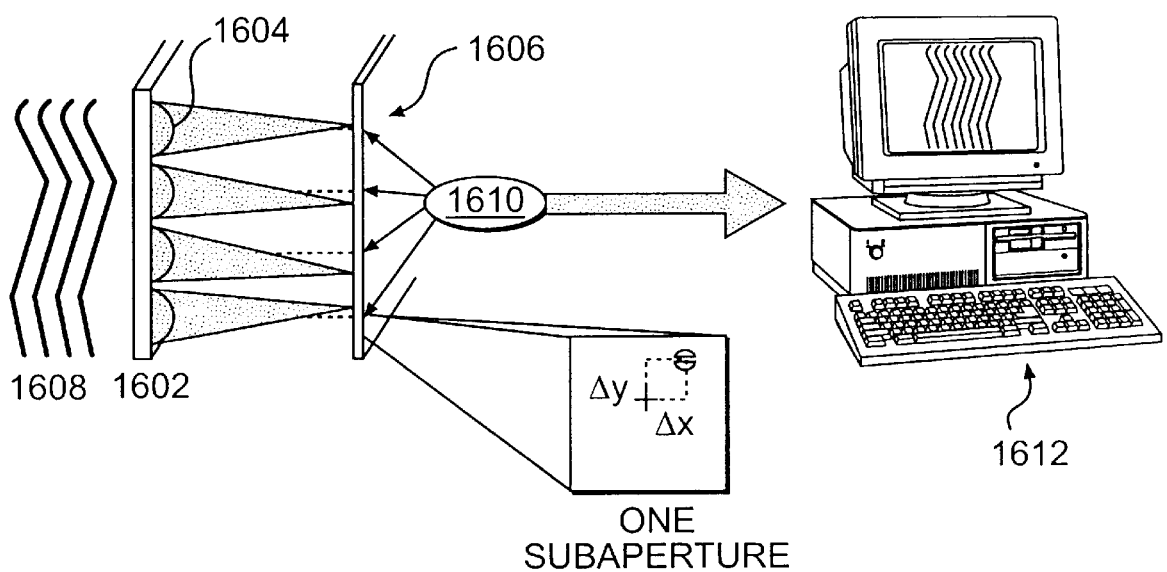
FIG. 16 illustrates in schematic form a wavefront sensor of the present invention.

In addition the present invention contemplates wave front sensors having an array of similar sized microlenses, such as the wavefront sensor shown in FIG. 16. In FIG. 16 a two-dimensional array 1602 of microlenses 1604 is placed in front of a CCD or photodetector array 1606. When a wavefront 1608 passes through the array 1602 and is detected by the CCD or photodetector array 1606, a signal 1610 is transferred to a computer 1612. As the wavefront reaches the array, the phase relation may be calculated from information supplied by the focal spot position. In the past, large lenses, hundreds of microns in diameter, have been used to detect long wavelengths. In contrast, a microlens array of the present invention is capable of detecting wavefront variation for much shorter wavelengths.

The present invention also contemplates an LED incorporating the microlens of the present invention. LEDs may be made more efficient by using a microlens to capture more of the incoming light. In the past, wet-etched silicon masks have been used to improve the efficiency of microcavity LEDs. In the present invention, the use of RIE etched silicon masks in forming microlenses for LEDs may provide much greater flexibility in choosing lens characteristics.

The present invention also contemplates a VCSEL incorporating a microlens of the present invention. There are several applications, such as two-dimensional parallel optical interconnects, where a tightly focused beam is required from a VCSEL. This is typically realized through the use of external micro-optics. However, by growing a lens on the top side of a VCSEL, this collimation may be more precisely and inexpensively controlled.

Figure 17:
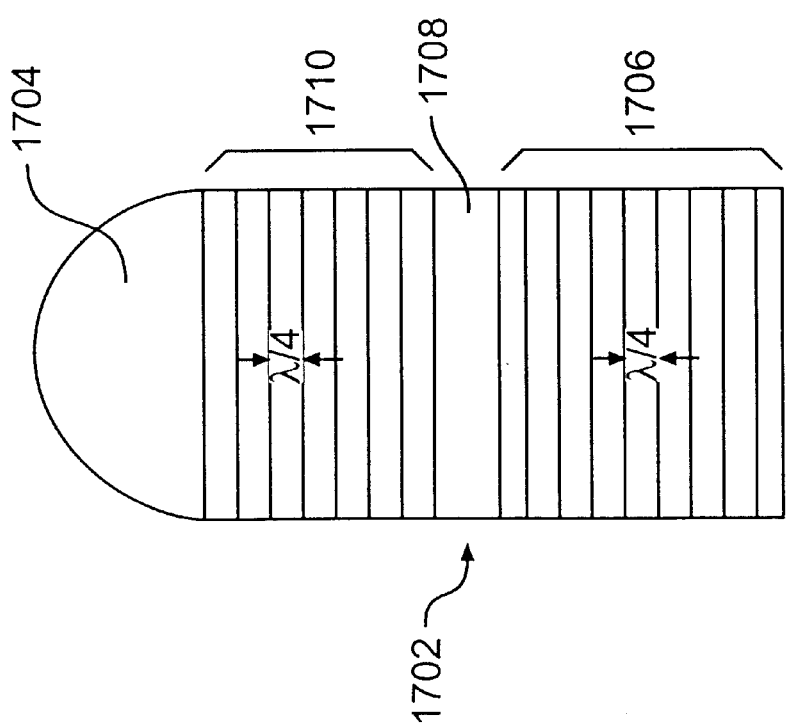
FIG. 17 illustrates in schematic form a cross-section view of a VCSEL with integrated microlenses of the present invention.

FIG. 17 illustrates a VCSEL 1702 of the present invention with an integrated microlens 1704. The VCSEL 1702 includes a set of layers comprising a bottom distributed Bragg reflector (DBR) 1706, an active region 1708 and a set of layers comprising a top DBR 1710. The layers of the bottom DBR 1706 and top DBR 1710 are typically alternating layers of two different semiconductor materials, such as GaAs and AlGaAs.

The present invention also contemplates a VCSEL with part of its Bragg mirror layers grown by shadow-masked CVD. By growing part of the upper mirror layers using the method of the present invention, the thickness profile of each mirror layer may be controlled. This detunes the upper mirror reflectivity from the bottom mirror, which in turn detunes the resonance wavelength and cavity loss. These may be treated as a shift in the complex effective index of the cavity. Hence, by carefully controlling the thickness of each mirror layer, the complex effective index profile may be varied concentrically around the propagating axis of the VCSEL. By growing part of the upper mirror stack as a convex or concave structure about the central axis, as shown in FIGS. 18 and 19, respectively, a variety of VCSEL structures with varying lateral profiles may be realized, with improved spatial mode performance.

Figure 18:
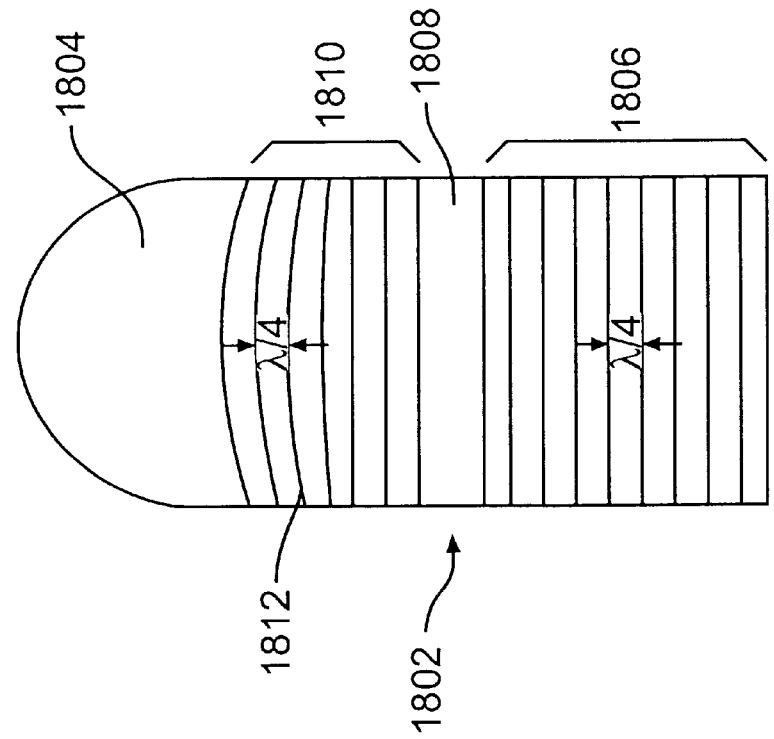
FIG. 18 illustrates in schematic form a cross-section view of a convex VCSEL with integrated microlens of the present invention.

FIG. 18 illustrates a convex VCSEL 1802 of the present invention with an integrated microlens 1804. The convex VCSEL 1802 includes a set of layers comprising a bottom DBR 1806, an active region 1808 and a set of layers comprising a top DBR 1810 having several convex layers 1812 in the region adjacent to the microlens 1804. The convex layers 1812 are grown using the method of the present invention to the convex layers (non-planar microstructures) 1812 on top of each other, with each previously grown layer acting as a substrate for each successively grown layer. The layers of the bottom DBR 1806 and top DBR 1810 are typically alternating layers of two different semiconductor materials, such as GaAs and AlGaAs. This structure enhances the fundamental mode operation of the VCSEL due to the increased cavity losses of the higher order spatial modes. Since most of the power in the fundamental mode is near the central axis, this mode is preferably selected as the lasing mode of the cavity. In some applications, it may be desirable for the convex VCSEL 1802 to not include the integrated microlens 1804.

Figure 19:
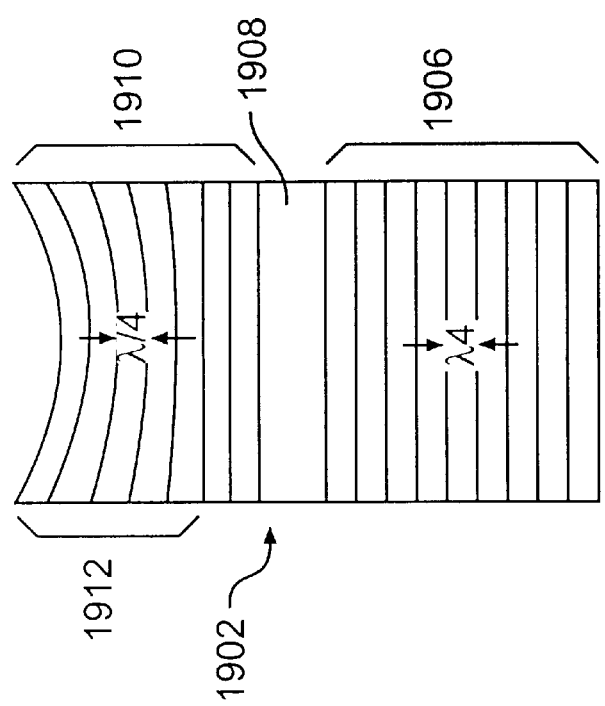
FIG. 19 illustrates in schematic form a cross-section view of a concave VCSEL of the present invention.

FIG. 19 illustrates a concave VCSEL 1902 of the present invention. The concave VCSEL 1902 includes a set of layers comprising a bottom DBR 1906, an active region 1908 and a set of layers comprising a top DBR 1910 having several concave layers 1912 at the top. The concave layers 1912 are grown using the method of the present invention to grow the concave layers (non-planar microstructures) 1912 on top of each other, with each previously grown layer acting as a substrate for each successively grown layer. The layers of the bottom DBR 1906 and top DBR 1910 are typically alternating layers of two different semiconductor materials, such as GaAs and AlGaAs. This structure introduces antiguiding in the VCSEL cavity as well as increased cavity losses for the higher order spatial modes. This makes it behave like an unstable resonator. Unstable resonators have been successfully used in edge-emitters to achieve high power and single mode operation in broad area laser devices. The present invention contemplates a method to achieve the same results in a VCSEL.

Figure 20:
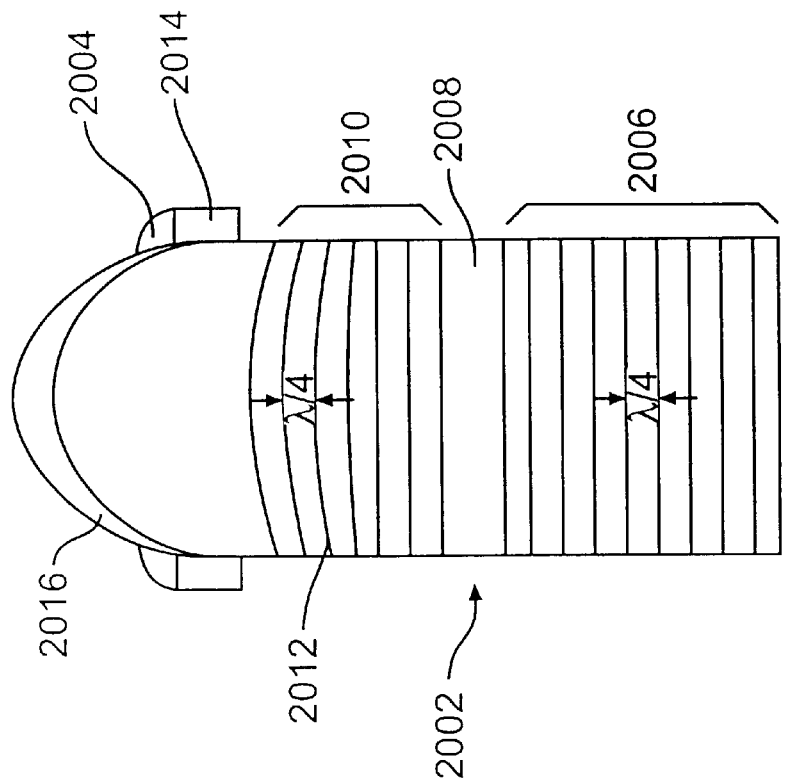
FIG. 20 illustrates in schematic form a cross-section view of a convex VCSEL with integrated microlens of the present invention and an ITO contact.

Prior methods for making contact to the p-side for the top emitting VCSEL have usually consisted of an annular ring Au alloy. The present invention contemplates using an ITO "see through" contact that covers the whole emitting surface of the VCSEL and an embodiment of the present invention using such an ITO contact is shown in FIG. 20. This type of contact will increase the pumping in the central region of the VCSEL and may further increase the single mode power. FIG. 20 illustrates a convex VCSEL 2002 of the present invention with an integrated microlens 2004. Using shadow masked growth, it is also possible to create a distributed DBR mirror with a concentrically variable refractive index. The convex VCSEL 2002 includes a set of layers comprising a bottom DBR 2006, an active region 2008 and a set of layers comprising a top DBR 2010 having several convex layers 2012 in the region adjacent to the microlens 2004. A ring 2014 of Au alloy surrounds a base region of the microlens 2004 and covering the top of the microlens 2004 is an ITO contact 2016. Although only a convex VCSEL is shown in FIG. 20, an ITO contact may be used with a concave VCSEL in a similar fashion.

Figure 21:
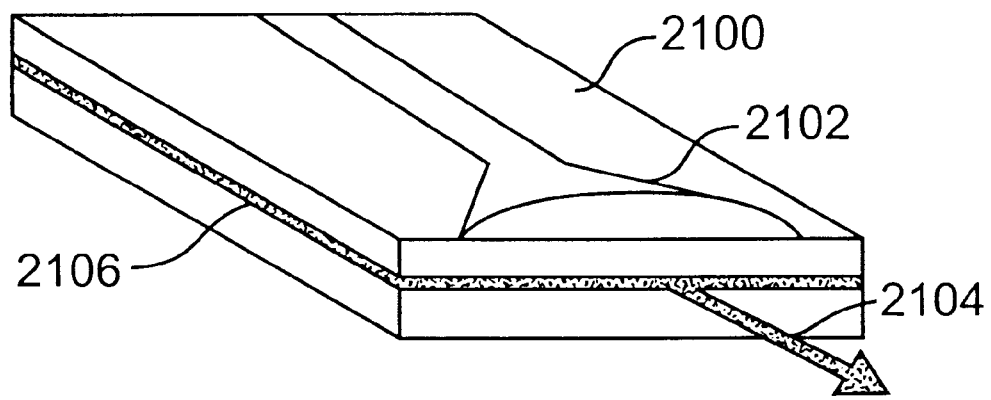
FIG. 21 illustrates in schematic form an edge emitting laser including a beam expander.

To efficiently couple light from an edge emitting laser into an optical fiber, the beam needs to be conditioned. One way to condition the beam is to use a tapered beam expander that is integrated into the laser and butt couple the optical fiber onto the laser in a lensless system. into an FIG. 21 illustrates an edge emitting laser 2100 which includes a beam expander 2102 which may be formed using the method of the present invention on the surface of the laser 2100. An arrow 2104 indicates the direction of the emitted light beam from an active region 2106.

Figure 22:
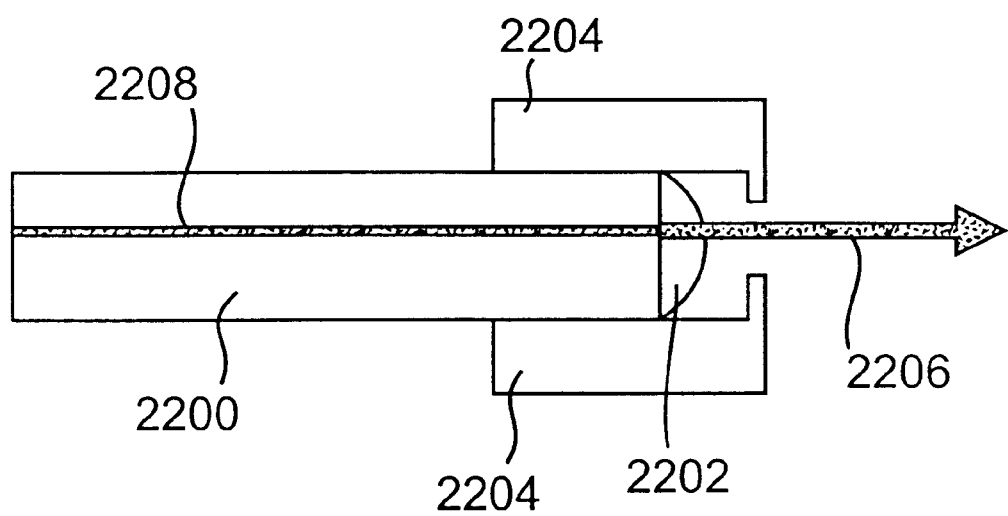
FIG. 22 is a schematic cross-sectional view of an edge emitting laser including a microlens of the present invention.

Another way of conditioning the beam from an edge emitting laser is to use a microlens of the present invention. FIG. 22 illustrates an edge emitting laser 2200 which includes a microlens 2202 on one end. Mounted around one end of the laser 2200 is a shadow mask or church 2204 which may be used to form the microlens on the end of the laser 2200. An arrow 2206 indicates the direction of an emitted light beam from an active region 2208.

The present invention will now be described by way of example.

EXAMPLE 1

The microlenses were fabricated using an shadow masked CVD microlens fabrication process that used an epitaxial mask grown by MOVPE that was then patterned by conventional photolithography and wet etching. The sample was then returned to the reactor for shadow masked growth.

In the present example, the geometrical parameters of the mask had the values following values shown in Table 1:

TABLE 1

| Parameter | Value |
| --- | --- |
| Spacer layer thickness h | 10 μm |
| mask layer thickness d | 2, 4 μm |

TABLE 1-continued

| Parameter | Value |
| --- | --- |
| Mask overhang distance v | 10 μm |
| Window width w | 5, 10, 15, 20, 25 μm |

The mask layers used were grown epitaxially using a conventional, horizontal CVD reactor (Thomas Swan & Co., Ltd.). The mask layers consisted of an $Al_{0.92}Ga_{0.08}As$ spacer and a GaAs mask layer. Accurate control of the AlAs mole fraction was important for process reproducibility and this was verified using X-ray diffraction and analyzed according the method described by Tanner et al., *Appl. Phys. Lett.*, 59, 2272 (1991). The mask was patterned by photolithography and a two step etch. The lens patterns were first etched into the GaAs mask layer using a 1:1:20 solution of $NH_4OH:H_2O_2: H_2O$ at room temperature. A selective etch solution of $KI:I_2: H_3PO_4$ (pH<2) was then used to transfer the pattern into the $Al_{0.92}Ga_{0.08}As$ spacer and to undercut the GaAs mask by approximately 10 μm. The etched structure was then returned to the CVD reactor for shadow masked growth. In the present example, 4 μm of GaAs was grown at 500 Å/min (this was the growth rate on top of the mask layer, within the masked apertures the growth rate was lower) at 725° C. and with a V/III ratio of 50. The sources used were arsine, trimethylgallium and trimethyl aluminum. Following shadow masked growth, the mask layers were removed by a lift-off process where the $Al_{0.92}Ga_{0.08}As$ spacer layer was etched in a 1:10 $HF:H_2O$ solution, by volume, for 10 hours. The high selectivity of this etch allowed the underlying GaAs to be continuously exposed to the etch for up to 48 hours without surface degradation.

Figure 3:
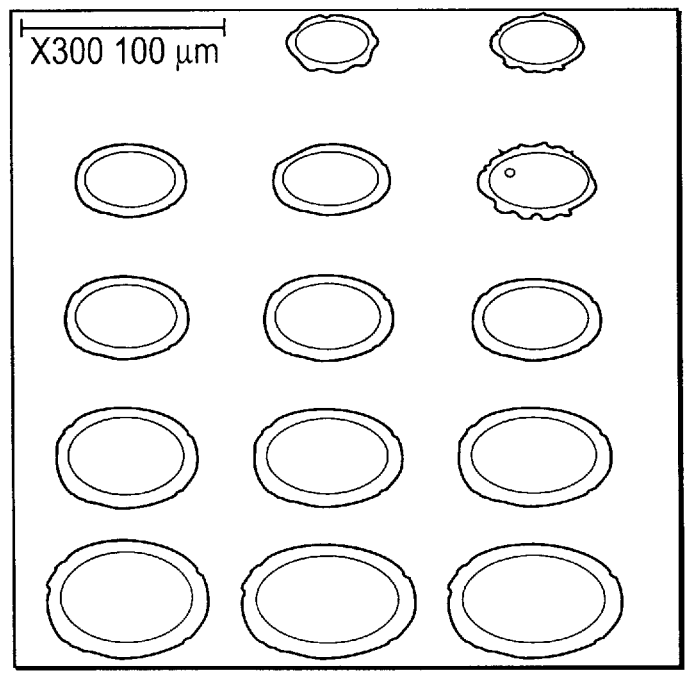
FIG. 3 illustrates the lens array of FIG. 3 with the mask removed.

FIG. 2 is a scanning electron microscope (SEM) image of part of a microlens array after shadow masked growth with the mask still in place. FIG. 3 shows the array, with lens diameters between 32 and 78 μm, after the mask has been removed. This perspective view shows clearly the absence of facetting on these lenses. Also, as the microlens diameter exceeds 60 μm, the lens profile flattens at the center.

Figure 4:
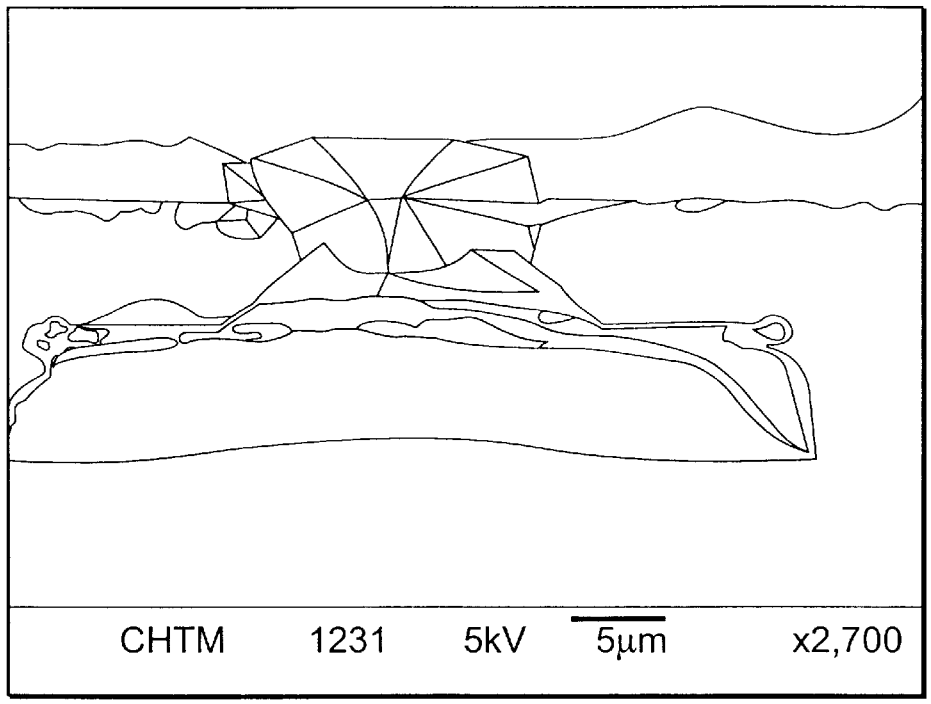
FIG. 4 is a cross-section of a microlens of the present invention.
Figure 5:
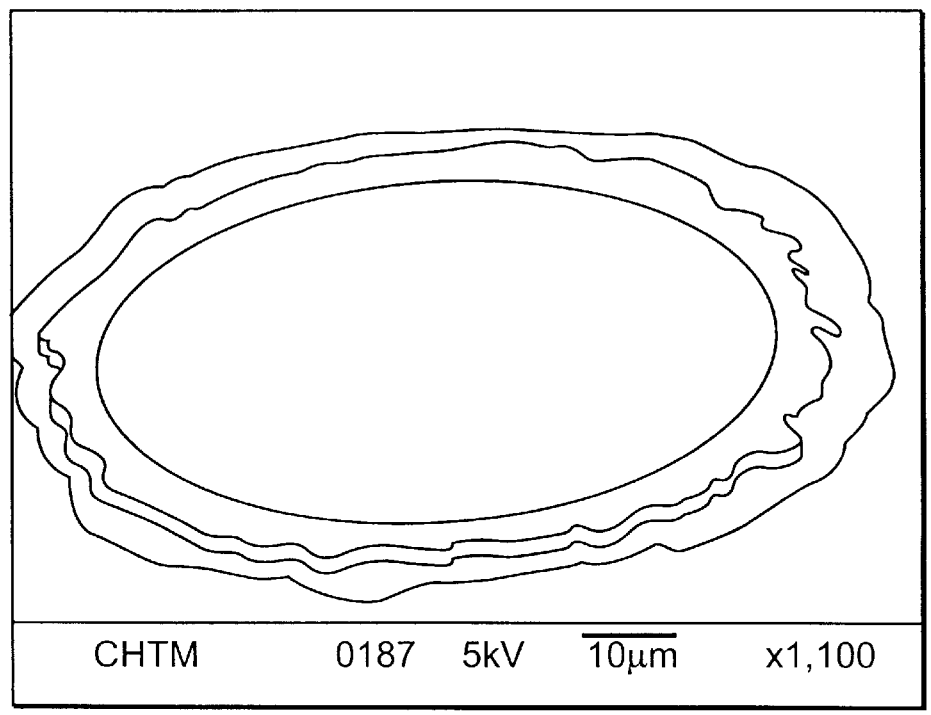
FIG. 5 is a SEM of an astimagtic microlens of the present invention.
Figure 6:
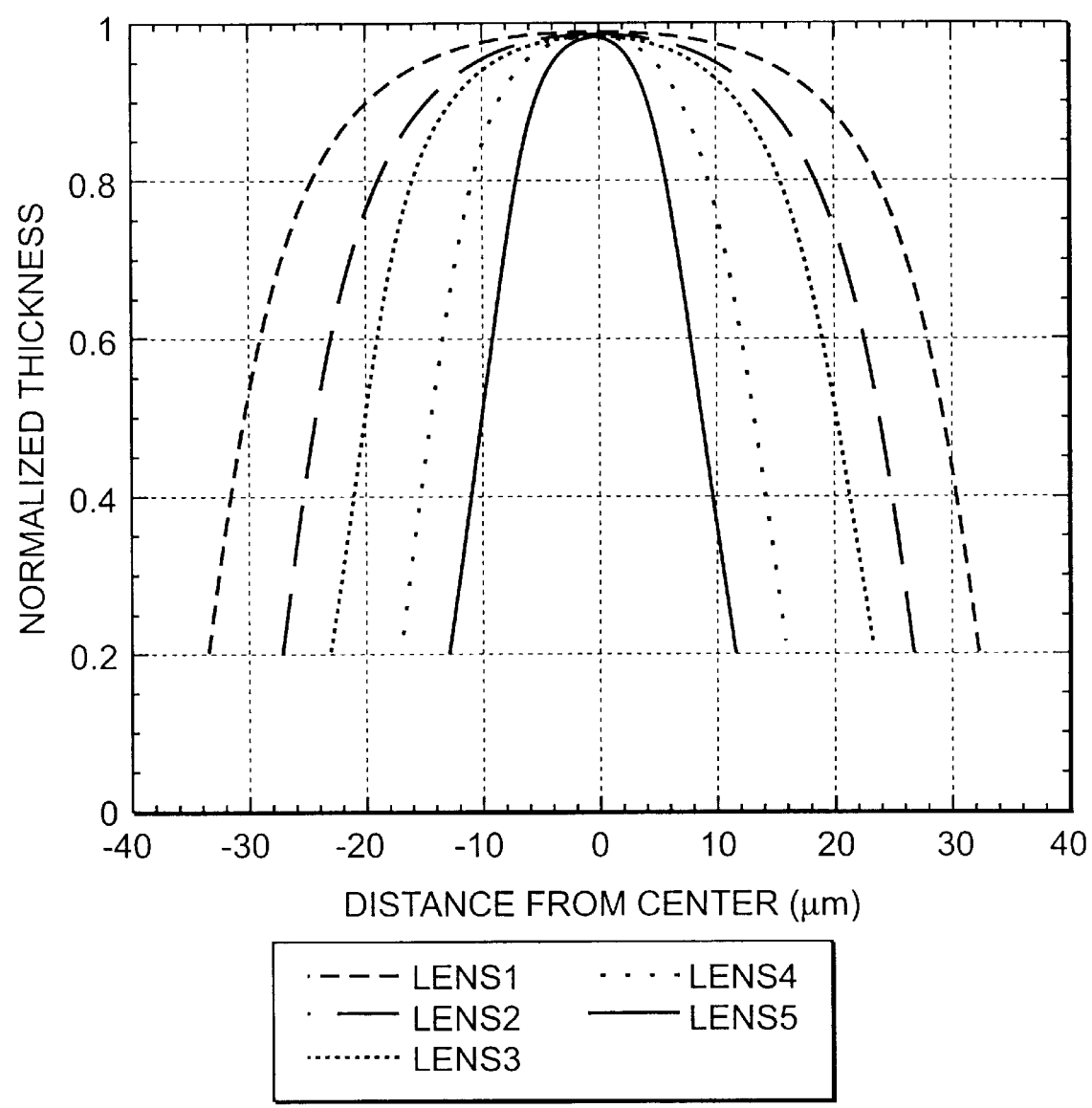
FIG. 6 is a graph of profilometer measurements of microlenses of the present invention.

Close examination of a cross section of the smallest lens, shown in FIG. 4, after shadow masked growth confirms that facetting is completely absent on the lens. However, facetting is apparent on the overhanging GaAs mask. When a thick GaAs mask layer is used, or a thick lens is grown, this facetting may distort the circular mask pattern and cause the lens to become astigmatic. In one direction, the mask growth is dominated by fast growing (1 1 1)A planes, while in the orthogonal direction the mask growth is dominated by slower growing (1 1 1)B planes. Thus, as growth proceeds, a circular mask pattern will tend to become more faceted and less circular, causing the underlying lens shape to become elliptical and, therefore, astigmatic. In the experiments of the present example, growths with the 2 μm GaAs mask gave circular lenses while lenses grown using the 4 μm mask showed a significant astigmatism, see FIG. 5. Surface profilometry of the lenses further confirmed the smooth facet free profile and allowed for the measurement of the physical shape of the microlenses. FIG. 6 shows the profilometer measurements for the microlenses.

Figure 7:
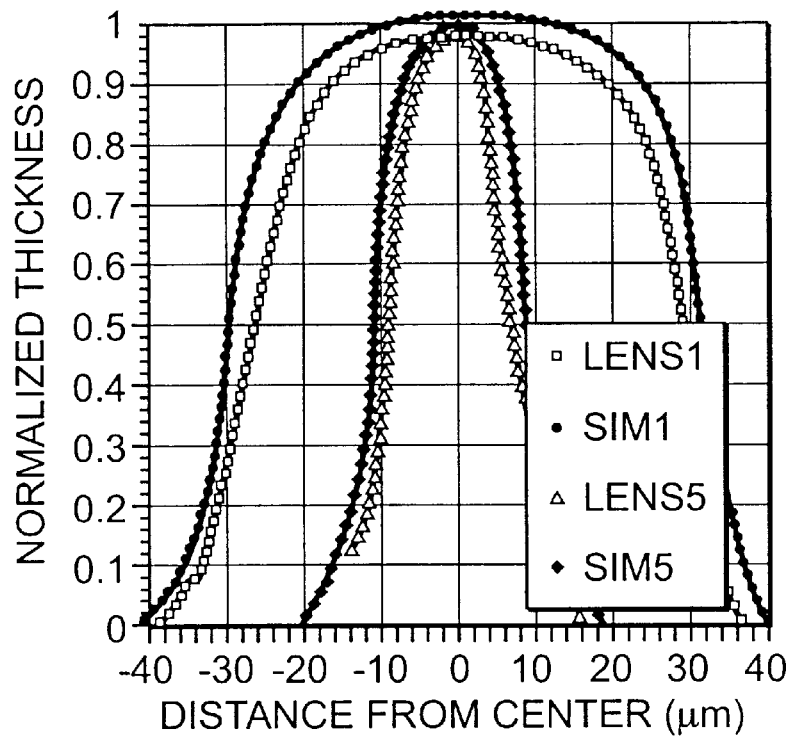
FIG. 7 is a graph illustrating a comparison between actual and simulated lens profiles.

The surface profile of small aperture lenses may be accurately fitted by a conical section. For example, a correlation coefficient of 0.99 was calculated for a lens diameter of 32 μm. for larger lenses having an aperture greater than 60 μm, the center of the lenses was flatter and resulted in a reduced correlation coefficient. For example, a correlation coefficient of 0.85 was calculated for a lens diameter of 78 μm. This flattening also appears in the simulation of shadow masked growth and occurs when the mask opening becomes large enough such that the growth reverts to conventional, unmasked, growth. FIG. 7 shows the simulated growth rate as of position for two of the aperture widths used in the present example and for a constant spacer height of 10 μm. The fit between the actual and simulated profile is excellent both for the small, spherical, and large, non-spherical, lenses.

Figure 8:
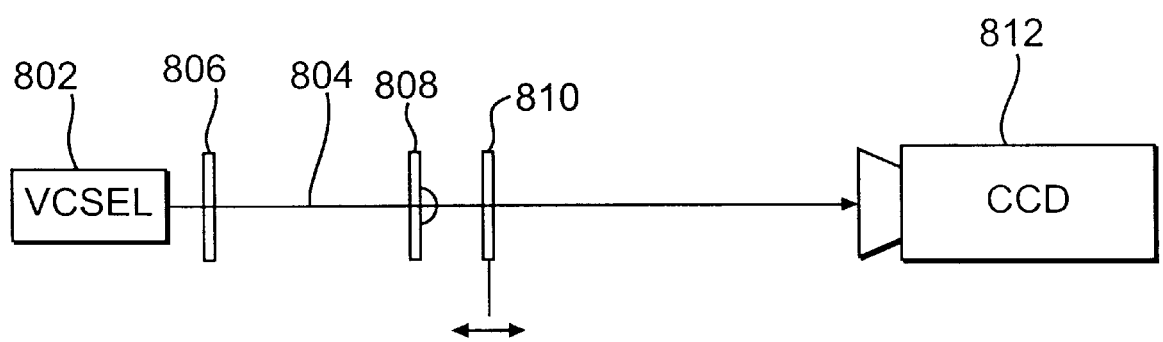
FIG. 8 is a schematic illustration of the set-up used to measure the focal length of the lenses of Example 1.

The focal lengths of the microlenses was measured using the set-up shown in FIG. 8. A VCSEL 802 generates a laser beam 804 which passes through a collimating lens 806, a microlens array 808, a 20X objective lens 810 and is imaged on a CCD camera 812. The substrates were prepared by polishing the backside to reduce scatter. Using 950 nm light from the collimated VCSEL the lens surface was imaged on a CCD camera. The 20X objective lens was then translated to image the focal point. This translation was performed on 1 μm resolution translation stage and repeated several times to ensure precision.

Figure 9:
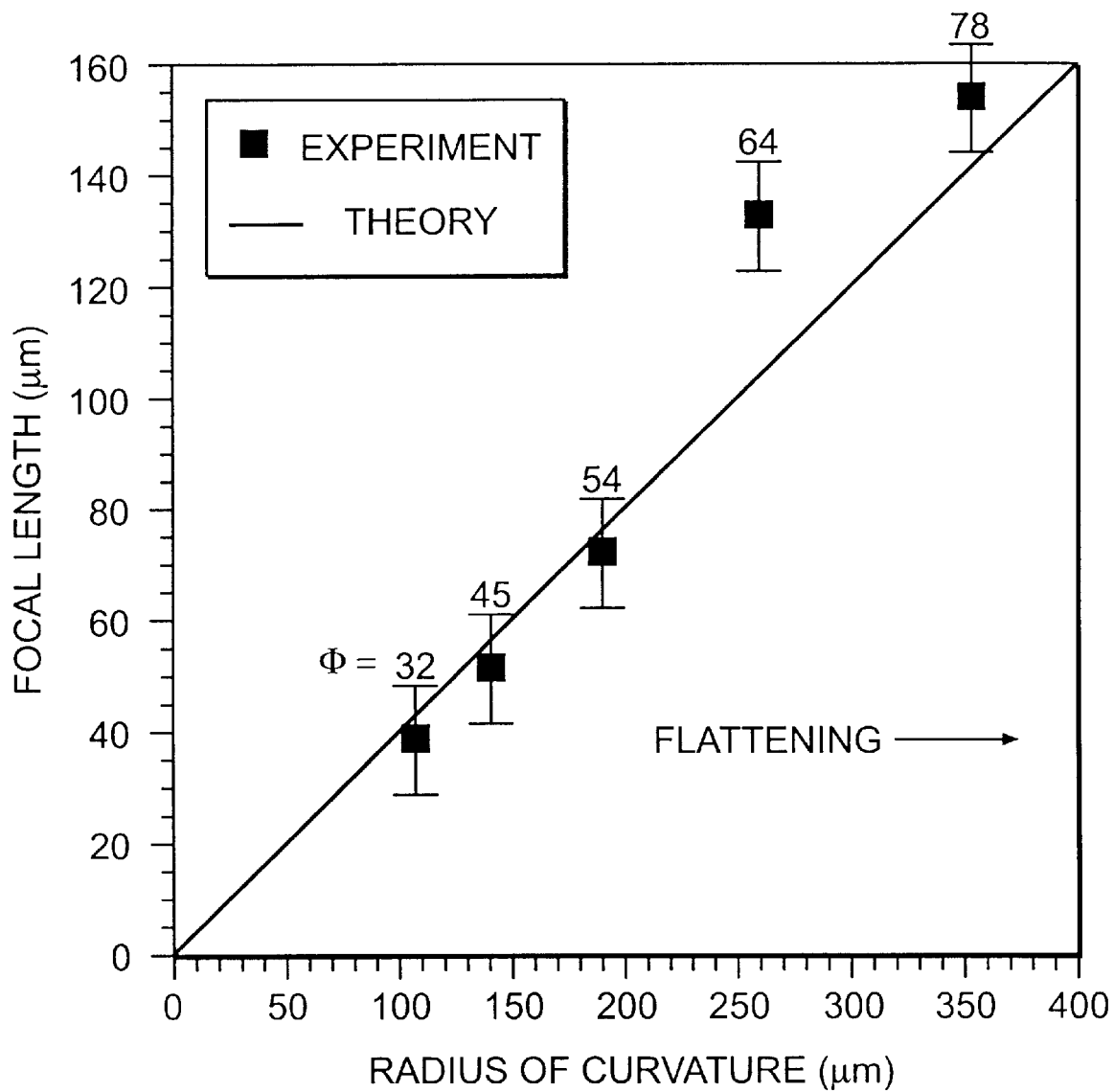
FIG. 9 is a graph of focal length as a function of the radius of curvature of a microlens.

A speckle generator was used to diffuse the VCSEL light when imaging the lens surface, while the undisturbed beam was use to image the microlens focal point. This allowed the same wavelength of light to be used for imaging the lens surface and for locating the focal point of the lens. For focal length measurements, the lens surface location was defined as shown in FIG. 8 and the focal point was assumed to be located at the minimum beam waist in front of the microlens. The accuracy of the focal length measurement was estimated to be approximately ±10 μm. The measured focal lengths and those calculated using the simple spherical lens approximation (described below) are plotted in the graph of FIG. 9.

A spherical approximation of the lenses was used for initial design of the microlens arrays. The focal length f was derived from the aperture Φ, the sagittta s, the effective index n, and the radius of curvature r.

The spherical approximation is valid for lens focal lengths up to 80 μm and for apertures less than 60 μm. However, for larger apertures where the lens profile flattens, the approximation is no longer valid. The focal lengths measured for different lenses within the array are listed in Table 2 below. The standard deviations of the focal lengths for 10 lenses of each size was consistently below the experimental error (±10 μm) of the measurement for each lens, indicating excellent uniformity of microlens shape across the array.

TABLE 2

| Diameter | Sagitta | Focal Length Theoretical | Focal Length Experimental | FWHM Theoretical | FWHM Experimental |
|---|---|---|---|---|---|
| 32 | 1.21 | 42 | 39 | 1.29 | 1.33 |
| 45 | 1.77 | 57 | 52 | 1.24 | 1.25 |
| 54 | 1.92 | 76 | 72 | 1.37 | 1.37 |
| 64 | 2.00 | 102 | 132 | 1.56 | 1.57 |
| 78 | 2.17 | 139 | 152 | 1.74 | 1.78 |

Figure 10:
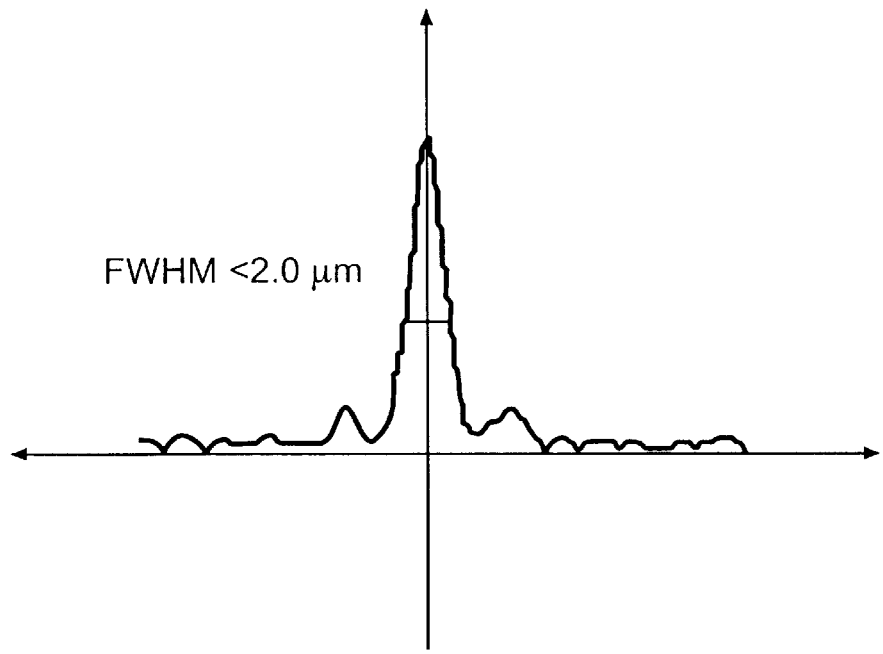
FIG. 10 is a graph of intensity distribution at a focal point

The quality of the lens may be further assessed by measuring the intensity distribution at the focal point, which in a well behaved lens should be described by an Airy function: $I_x=I_0[2J_1(x)/x]^2$, with a diffraction limited spot size of 2.44 λf/Φ, where λ is the wavelength, $J_1$ is the first order Bessel function, x is the distance and $I_0$ is the peak intensity. Close examination of this intensity distribution, shown in FIG. 10, shows a distinct Airy pattern. Measurements of the FWHM of the intensity profile at the beam waist are also listed in table 2 above, and show that all the microlenses, including the larger lenses, are operating at the diffraction limit.

EXAMPLE 2

Figure 11:
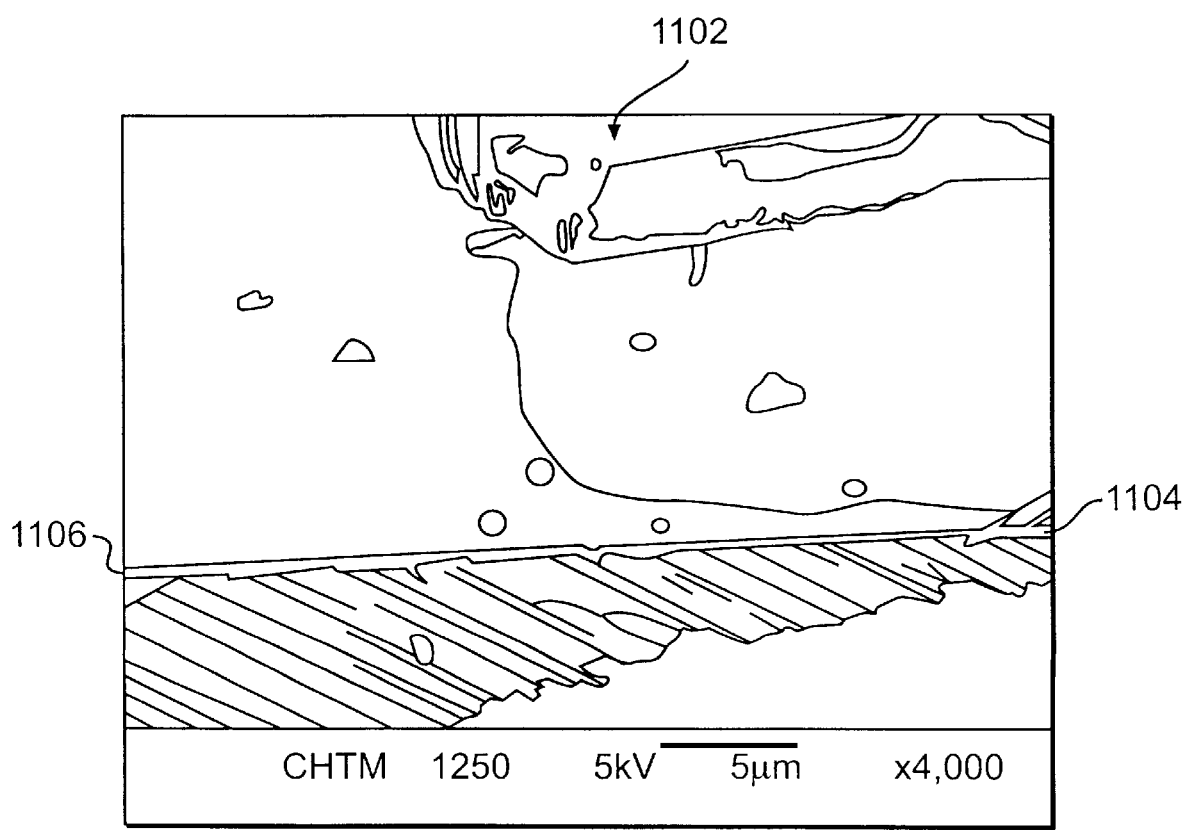
FIG. 11 is an SEM of silicon nitride deposited under a shadow mask.

Silicon nitride was deposited using a plasma enhanced CVD (PECVD) technique under a shadow mask as shown in FIG. 11. The silicon nitride deposited through a shadow mask 1102 had a smooth variation in thickness from a thin end 1104 to a thick end 1106. This smooth variation in thickness indicates that a microlens of the present invention could be grown using silicon nitride.

EXAMPLE 3

Figure 12:
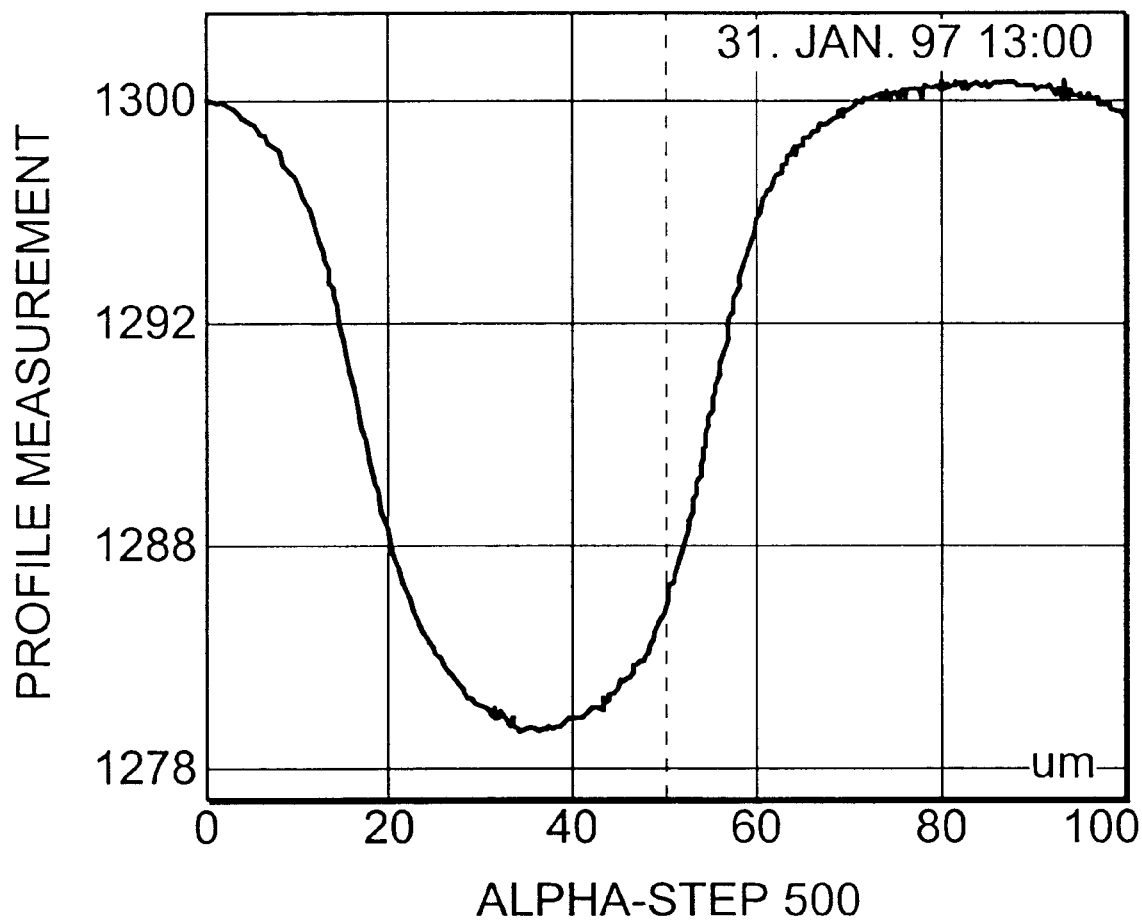
FIG. 12 is a profilometer measurement of a micromirror of the present invention.
Figure 23:
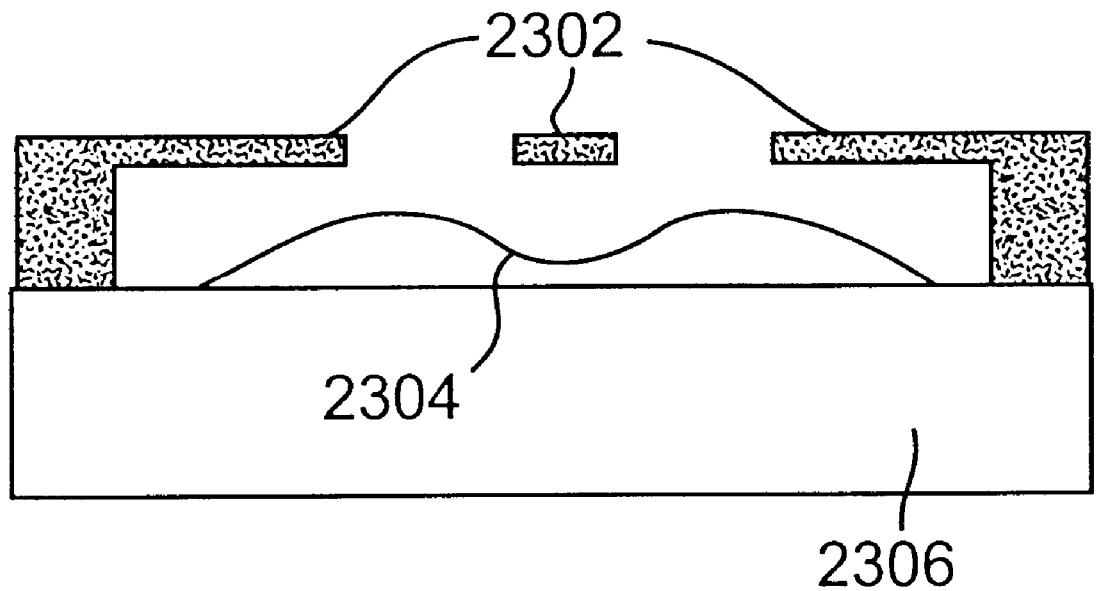
FIG. 23 is a schematic cross-sectional view of the deposition of a concave layer using a modified shadow mask.

A modified shadow mask 2302 as shown in FIG. 23 was used to deposit a concave layer 2304 on a substrate 2306. A graph of profilometer measurement of the growth using the modified shadow mask of FIG. 23 is shown in FIG. 12. The ordinate of the graph in FIG. 12 is the height with 1 μm/division and the abscissa is the distance with 20 μm/division. The above experiment and the results shown in FIG. 12 evidence that the method of the present invention may be used to fabricate concave mirrors. Such mirrors may be used in optical systems such as wavefront measurement, unstable resonator VCSELs, or imaging optics, such as CCDs.

EXAMPLE 4

Figure 13:
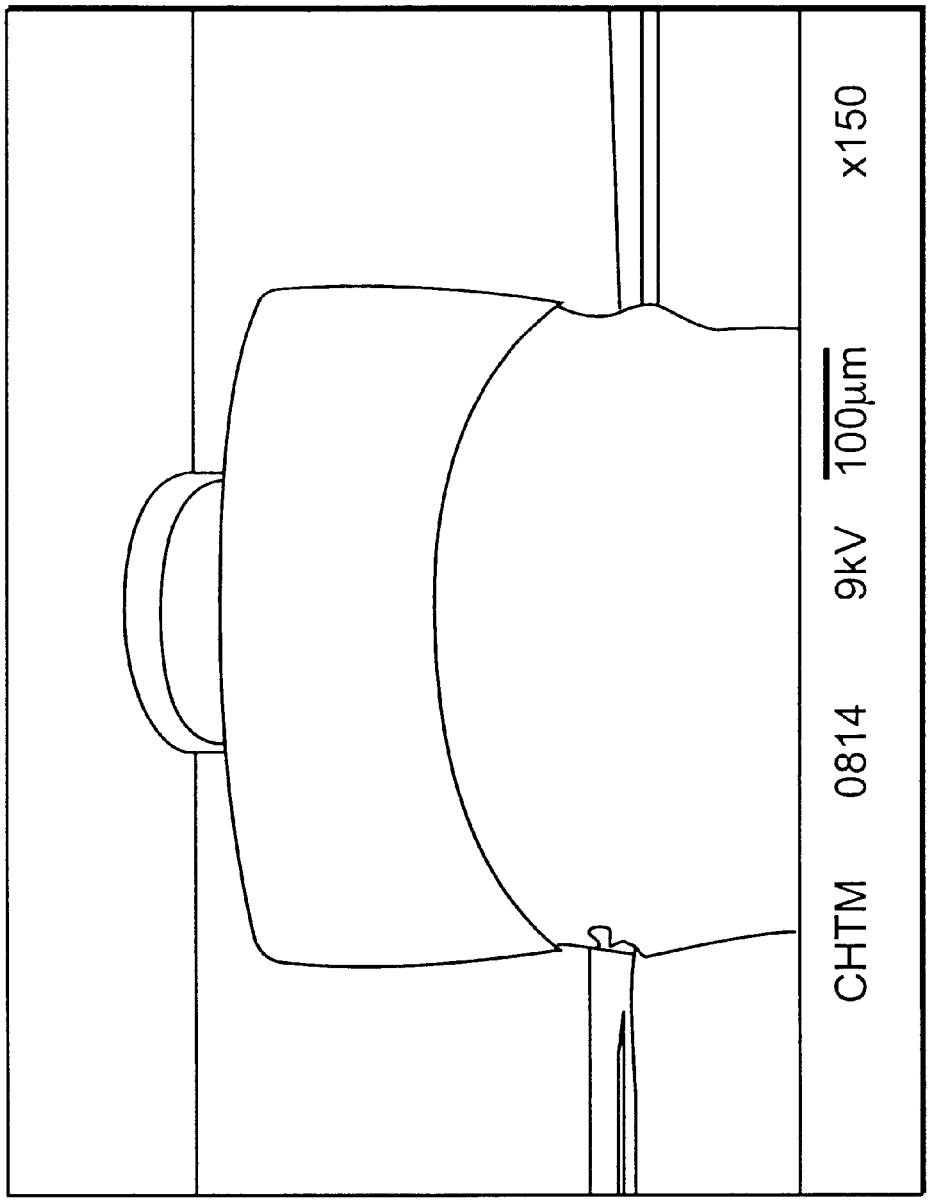
FIG. 13 is scanning electron micrograph of a deep RIE etched mask of the present invention.
Figure 14:
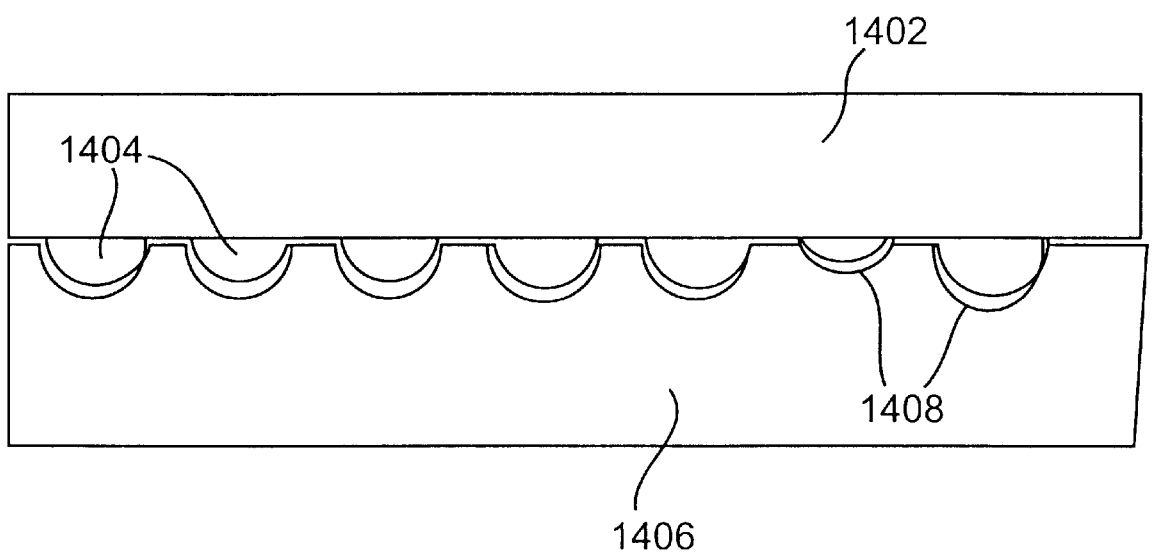
FIG. 14 illustrates a cross section view of two aligned substrates on which there are mounted microlenses of the present invention.

Using a deep reactive ion etch (RIE), a micromachined mask was produced by etching a large aperture form the bottom of a silicon wafer, and aligning and etching a smaller hole that etched through to the bottom hole. The etch depth through the bottom aperture defines the maximum "spacer height", but the spacer height may be reduced by lapping and polishing. Shadow masks with window widths from 5 to 200 μm and spacer heights from 10 to 300 μm have been produced. Previously, silicon masks have been fabricated by wet chemical etching and the mask shapes are limited by facetting produced in these etches. The deep RIE process allows the sidewall feature to be much sharper, approximately 90 degrees, compared with conventional KOH etching which produces sidewalls tilted at 57.4 degrees. The sharper sidewall of the mask also allows for much smaller features to be produced. An SEM of the deep RIE etched mask is shown in FIG. 13.

In general, epitaxial grown masks have had certain limitations when compared to the above-described micromachined mask. For example, epitaxial masks are deposited and used for only one shadow masked growth and epitaxy thicker than 10 microns is impractical and expensive for such a purpose. The 10 micron limit on the spacer layer also produces features with flattened centers for window width/spacer height ratios of around 10/1. In contrast, the micromachined mask of the present invention is reusable and saves time and expense.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. A non-faceted microlens consisting essentially of a non-amorphous material and having a focal length of 50 μm or less.

2. The microlens of claim 1, wherein said microlens has a focal length of 40 μm or less.

3. The microlens of claim 1, wherein said microlens has a focal length of 30 µm or less.

4. The microlens of claim 1, wherein said microlens has a diameter of 30 µm or less.

5. The microlens of claim 1, wherein said microlens is astigmatic.

6. The microlens of claim 1, wherein said microlens comprises a semiconductor material.

7. The microlens of claim 1, wherein said microlens comprises a group III–V semiconductor material.

8. The microlens of claim 1, wherein said microlens comprises GaAs.

9. An array of microlenses mounted on a substrate, each of said microlenses consisting essentially of a non-amorphous material and having a focal length of 50 µm or less.

10. The array of claim 9, wherein each of said microlenses has a focal length of 40 µm or less.

11. The array of claim 9, wherein said of said microlenses has a focal length of 30 µm or less.

12. The array of claim 9, wherein each of said microlenses has a diameter of 30 µm or less.

13. The array of claim 9, wherein each of said microlenses comprises a semiconductor material.

14. The array of claim 9, wherein each of said microlenses comprises a group III–V semiconductor material.

15. The array of claim 9, wherein each of said microlenses comprises GaAs.

16. The microlens of claim 1, wherein said microlens consists essentially of a crystalline material.

17. The array of microlenses of claim 9, wherein each of said microlenses consists essentially of a crystalline material.

* * * * *

UNITED STATES PATENT AND TRADEMARK OFFICE
CERTIFICATE OF CORRECTION

PATENT NO. : 6,122,109
DATED : September 19, 2000
INVENTOR(S) : Peake et al.

It is certified that error appears in the above-identified patent and that said Letters Patent is hereby corrected as shown below:

<u>Title page,</u>
Item [75], Inventors, after "Hersee," delete "both of" and insert -- Andrew M. Sarangan, all of --, therefor.

Signed and Sealed this

Twenty-second Day of February, 2005

JON W. DUDAS
*Director of the United States Patent and Trademark Office*